United States Patent
Li et al.

(10) Patent No.: US 12,464,752 B2
(45) Date of Patent: Nov. 4, 2025

(54) METHOD OF FORMING SHAPED SOURCE/DRAIN EPITAXIAL LAYERS OF A SEMICONDUCTOR DEVICE

(71) Applicant: TAIWAN SEMICONDUCTOR MANUFACTURING COMPANY, LTD., Hsinchu (TW)

(72) Inventors: Yi-Jing Li, Hsinchu (TW); Ming-Hua Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 278 days.

(21) Appl. No.: 18/198,644

(22) Filed: May 17, 2023

(65) Prior Publication Data
US 2023/0290866 A1    Sep. 14, 2023

Related U.S. Application Data

(60) Continuation of application No. 17/364,623, filed on Jun. 30, 2021, now Pat. No. 11,695,063, which is a
(Continued)

(51) Int. Cl.
*H10D 30/01*    (2025.01)
*H01L 21/02*    (2006.01)
(Continued)

(52) U.S. Cl.
CPC ..... *H10D 30/024* (2025.01); *H01L 21/02381* (2013.01); *H01L 21/02576* (2013.01);
(Continued)

(58) Field of Classification Search
CPC ...... H01L 21/02609; H01L 21/823821; H10D 30/024; H10D 30/62; H10D 62/405;
(Continued)

(56) References Cited

U.S. PATENT DOCUMENTS 8,836,016 B2    9/2014    Wu et al.
8,841,701 B2    9/2014    Lin et al.
(Continued)

FOREIGN PATENT DOCUMENTS

KR    10-2011-0098594 A    9/2011
KR    10-2016-0045528 A    4/2016
KR    10-2017-0040723 A    4/2017

OTHER PUBLICATIONS

Pribat, Clement, et al. "Anisotropy effects during non-selective epitaxial growth of Si and SiGe materials", JOurnal of Crystal Growth 334 (2011) pp. 138-145.
(Continued)

*Primary Examiner* — Zandra V Smith
*Assistant Examiner* — John M Parker
(74) *Attorney, Agent, or Firm* — Studebaker Brackett PLLC

(57) ABSTRACT

In a method for manufacturing a semiconductor device, an isolation insulating layer is formed over a fin structure. A first portion of the fin structure is exposed from and a second portion of the fin structure is embedded in the isolation insulating layer. A dielectric layer is formed over sidewalls of the first portion of the fin structure. The first portion of the fin structure and a part of the second portion of the fin structure in a source/drain region are removed, thereby forming a trench. A source/drain epitaxial structure is formed in the trench using one of a first process or a second process. The first process comprises an enhanced epitaxial growth process having an enhanced growth rate for a preferred crystallographic facet, and the second process comprises using a modified etch process to reduce a width of the source/drain epitaxial structure.

20 Claims, 8 Drawing Sheets

Related U.S. Application Data continuation of application No. 16/725,655, filed on Dec. 23, 2019, now Pat. No. 11,056,578, which is a division of application No. 15/801,097, filed on Nov. 1, 2017, now Pat. No. 10,516,037.

(60) Provisional application No. 62/527,827, filed on Jun. 30, 2017.

(51) Int. Cl.

| | |
|---|---|
| *H01L 21/3065* | (2006.01) |
| *H10D 30/62* | (2025.01) |
| *H10D 62/13* | (2025.01) |
| *H10D 62/40* | (2025.01) |
| *H10D 84/01* | (2025.01) |
| *H10D 84/03* | (2025.01) |
| *H10D 84/85* | (2025.01) |

(52) U.S. Cl.
CPC .... *H01L 21/02609* (2013.01); *H01L 21/0262* (2013.01); *H01L 21/02639* (2013.01); *H01L 21/3065* (2013.01); *H10D 30/62* (2025.01); *H10D 62/151* (2025.01); *H10D 62/405* (2025.01); *H10D 84/017* (2025.01); *H10D 84/0193* (2025.01); *H10D 84/038* (2025.01); *H10D 84/853* (2025.01)

(58) Field of Classification Search
CPC .. H10D 62/151; H10D 84/853; H10D 84/017; H10D 84/038; H10D 84/0193
See application file for complete search history.

(56) References Cited

U.S. PATENT DOCUMENTS

| | | | |
|---|---|---|---|
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,490,365 B2 * | 11/2016 | Jangjian | H10D 84/017 |
| 9,520,482 B1 | 12/2016 | Chang et al. | |
| 9,576,814 B2 | 2/2017 | Wu et al. | |
| 2011/0068407 A1 | 3/2011 | Yeh et al. | |
| 2011/0147842 A1 | 6/2011 | Cappellani et al. | |
| 2011/0210404 A1 | 9/2011 | Su et al. | |
| 2013/0221447 A1 | 8/2013 | Lee et al. | |
| 2014/0183605 A1 | 7/2014 | Mochizuki et al. | |
| 2015/0123146 A1 | 5/2015 | Krishnan et al. | |
| 2016/0042963 A1 | 2/2016 | Kim et al. | |
| 2016/0111542 A1 | 4/2016 | Zhang et al. | |
| 2016/0315172 A1 | 10/2016 | Wu et al. | |
| 2017/0098547 A1 | 4/2017 | Kim et al. | |
| 2017/0098648 A1 | 4/2017 | Lee et al. | |
| 2017/0186748 A1 | 6/2017 | Lee et al. | |
| 2017/0200718 A1 | 7/2017 | Choi et al. | |
| 2017/0338345 A1 | 11/2017 | Reznicek et al. | |
| 2018/0006153 A1 | 1/2018 | Huang et al. | |
| 2018/0151563 A1 | 5/2018 | Chang et al. | |

OTHER PUBLICATIONS

Non-Final Office Action, U.S. Appl. No. 15/801,097 dated Mar. 21, 2019.

Notice of Allowance, U.S. Appl. No. 15/801,097 dated Oct. 23, 2019.

Non-Final Office Action issued in U.S. Appl. No. 16/725,655, dated Sep. 17, 2020.

Final Office Action issued in U.S. Appl. No. 16/725,655, dated Dec. 21, 2020.

Notice of Allowance issued in U.S. Appl. No. 16/725,655, dated Mar. 2, 2021.

Notice of Allowance issued in U.S. Appl. No. 17/364,623, dated Feb. 17, 2023.

* cited by examiner

METHOD OF FORMING SHAPED SOURCE/DRAIN EPITAXIAL LAYERS OF A SEMICONDUCTOR DEVICE

This application is a continuation of U.S. patent application Ser. No. 17/364,623 filed on Jun. 30, 2021, which is a continuation of U.S. patent application Ser. No. 16/725,655 filed on Dec. 23, 2019, now U.S. Pat. No. 11,056,578, which is a Divisional of U.S. patent application Ser. No. 15/801,097 filed on Nov. 1, 2017, now U.S. Pat. No. 10,516,037, which claims priority to U.S. Provisional Application 62/527,827 filed Jun. 30, 2017, the entire disclosure of the three applications are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as fin field-effect transistors (Fin FETs). In a Fin FET, a gate electrode is adjacent to two side surfaces of a channel region with a gate dielectric layer interposed between them.

In advanced technology nodes, the epi source or drain structure introduces issues for fin pitch scaling. The source and/or drain sheet resistance and contact resistivity can play an important role when the device area is scaling. Although large epitaxial source/drain volume is useful for device performance, but can go against yield in higher device densities, for example, in static random access memory (SRAM) chips. Solutions are required that can provide large epitaxial source/drain shapes for devices of a SRAM chip that are compatible with complementary metal-oxide-semiconductor (CMOS) flow, without adversely affecting the yield.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
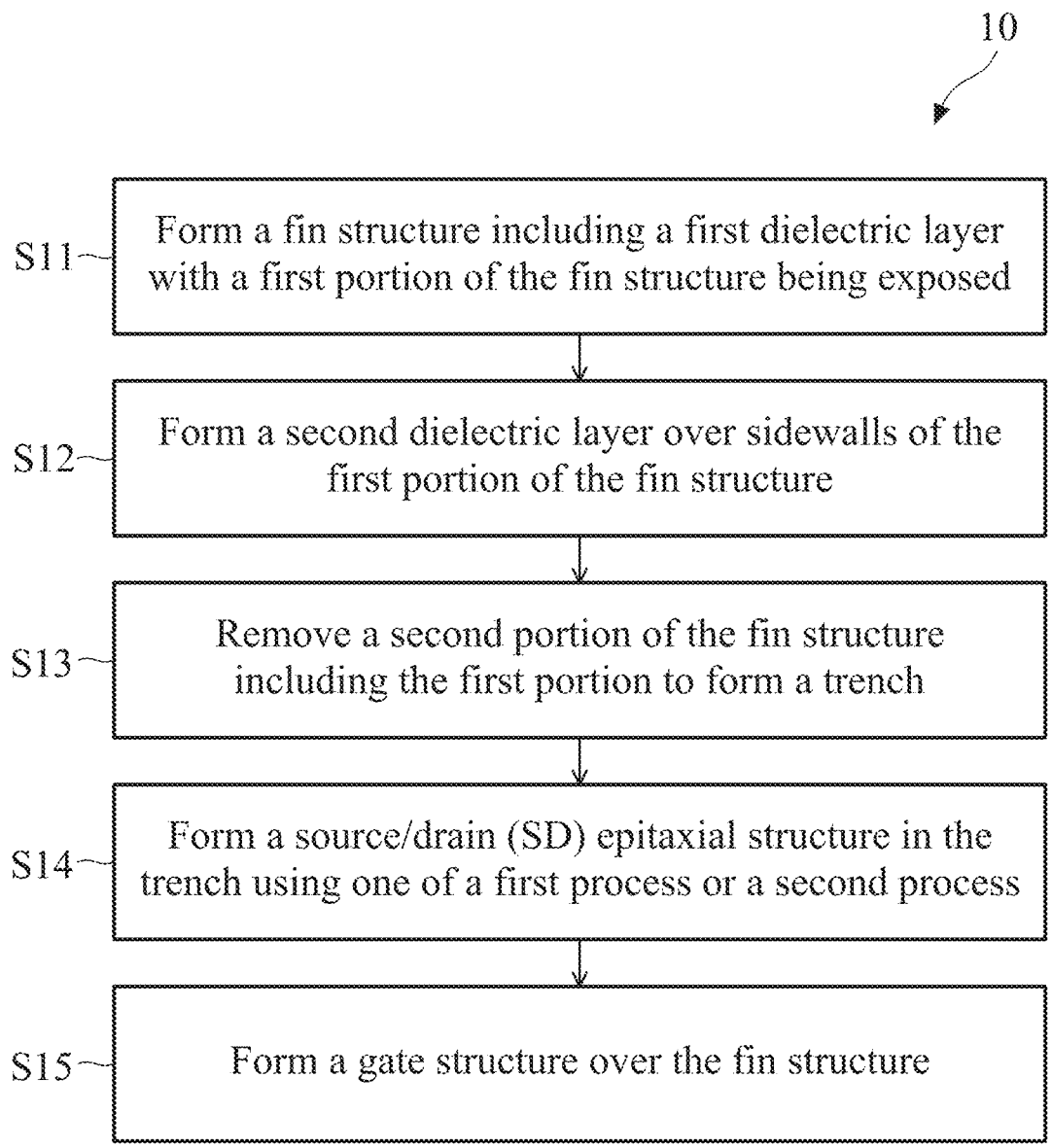
FIG. 1 is an exemplary process flow chart depicting a method of manufacturing a semiconductor device according to one or more embodiments of the present disclosure.

FIG. 1 is an exemplary process flow chart of manufacturing a semiconductor device according to one or more embodiments of the present disclosure. The flow chart 10 illustrates only a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable.

Figure 2A:
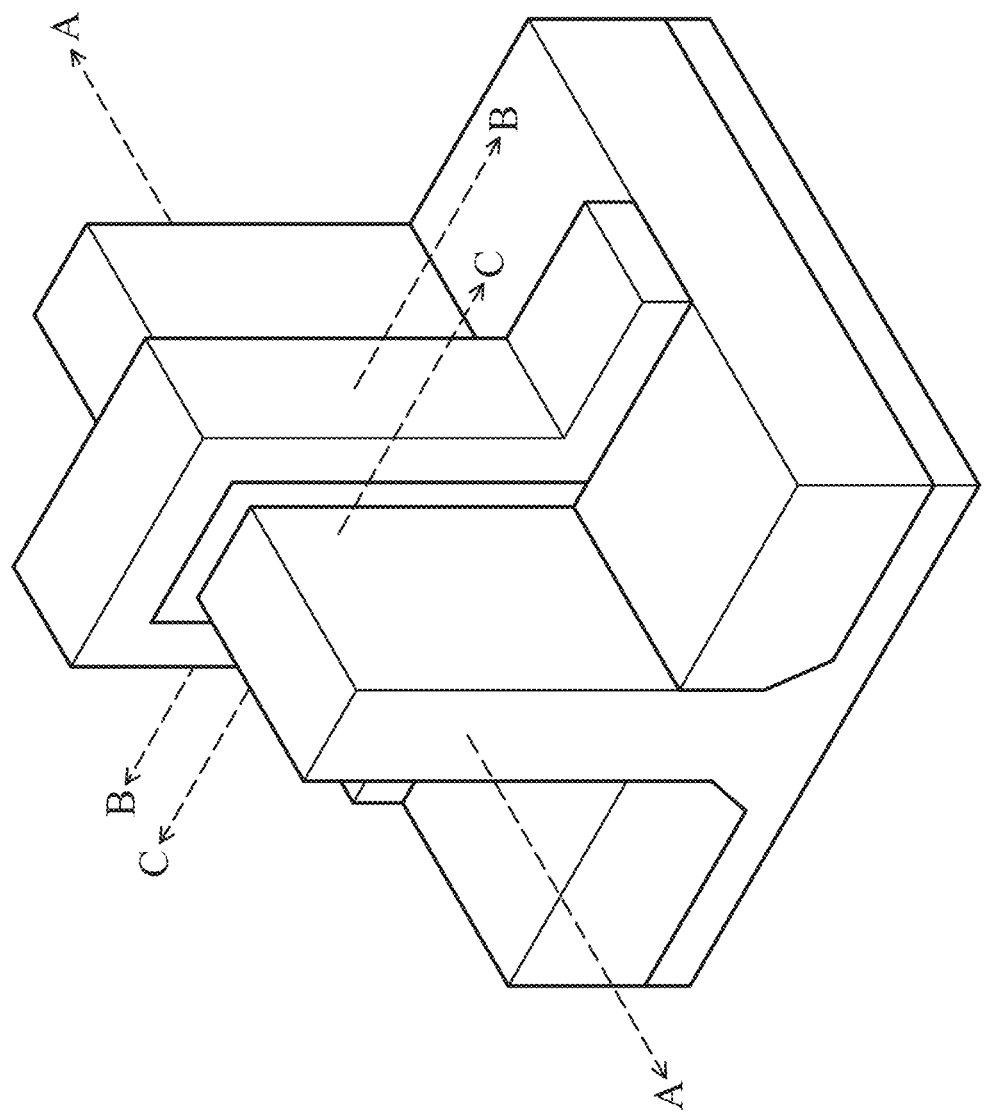
FIG. 2A depicts a three-dimensional view of a Fin FET.

FIG. 2A depicts a three-dimensional view of a Fin FET, in reference to which the cross sectional views 2B, 3 and 4 are described.

Figure 2B:
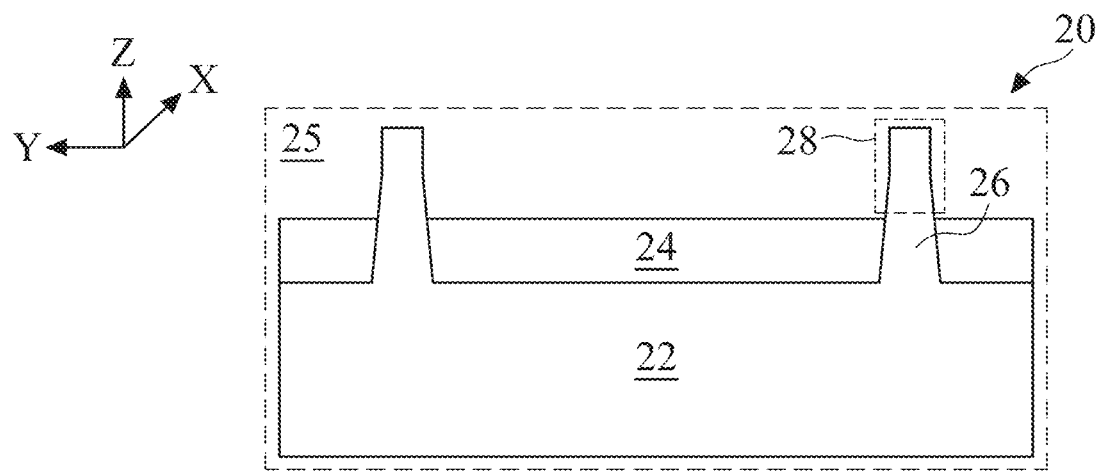
FIG. 2B depicts one stage in a method of manufacturing a semiconductor device according to one or more embodiments of the present disclosure.

In S11 of FIG. 1, a first structure 25, as depicted in an X-cut view 20, along line C-C' of FIG. 2A, is formed, as shown in FIG. 2B. The first structure 25 includes a fin structure 26 of a semiconductor device, for example a fin field-effect transistor (Fin FET) device, which can be an NMOS or a PMOS device. In some embodiments, the NMOS and PMOS devices can be parts of a static random access memory (SRAM) device, an oscillator such as a ring oscillator, or other circuitry of an integrated circuit, which can be produced at high device density.

The fin structure 26 can be formed on a substrate 22. The first structure 25 further includes a first insulating layer 24 that covers the substrate 22 and a portion of the height of the fin structure 26, such that a first portion 28 of fin structure 26 is exposed. The substrate 22 can be a p-type silicon substrate with an impurity concentration in a range of about $1\times10^{15}$ cm$^{-3}$ to about $3\times10^{15}$ cm$^3$ in some embodiments. In other embodiments, the base substrate can be an n-type silicon substrate with an impurity concentration in a range of about $1\times10^{15}$ cm$^{-3}$ to about $3\times10^{15}$ cm$^{-3}$. The crystal orientation of silicon substrate is (100) in some embodiments.

Alternatively, the substrate may comprise another elementary semiconductor, such as germanium, a compound semiconductor including Group Iv-Iv compound semiconductors such as silicon carbide (SiC) and silicon germanium (SiGe), and Group III-v compound semiconductors such as GaAs, GaP, GaN, InP, InAs, InSb, GaAsP, AlGaN, AlInAs, AlGaAs, GaInAs, GaInP, and/or GaInAsP, or combinations thereof. In one or more embodiments, the substrate is a silicon layer of an SOI (silicon-on-insulator) substrate. Amorphous substrates, such as amorphous silicon or amorphous silicon carbide (SiC), or insulating material, such as silicon oxide, may also be used as the base substrate.

The substrate may include various regions that have been suitably doped with impurities (e.g., p-type or n-type conductivity). In some embodiments, the fin structure 26 is made of the same material as the substrate 22. For example, the fin structure 26 can be made of the p-type silicon or the n-type silicon, in some embodiments. In some embodiments, the first insulating layer 24 can be shallow trench isolation (STI) material, the method of formation of which is known.

In some embodiments, after formation of the first insulating layer 24, a dummy gate structure is formed over portions of the fin structure 26 extending in the X direction. The dummy gate structure is not visible in the X-cut views 20 and 30 as these X-cut views are at different X positions than the position of the dummy gate structure. The dummy gate structure is formed over a channel layer, for example, a part of a fin structure 26. In some embodiments the dummy gate structure can correspond to short-channel FETs having a gate length Lg1 or a long channel FET having a gate length Lg2, where Lg1<Lg2<~30 nm. In some embodiments, the dummy gate structure includes a dummy gate electrode layer made of poly silicon and a dummy gate dielectric layer. Sidewall spacers including one or more layers of insulating materials are also formed on sidewalls of the dummy gate electrode layer. The sidewall spacers include one or more layers of insulating material such as silicon nitride based material including SiN, SiON, SiCN and SiOCN. The film thickness of the sidewall spacers at the bottom of the sidewall spacers is in a range from about 3 nm to about 15 nm in some embodiments, and is in a range from about 4 nm to about 8 nm in other embodiments.

The dummy gate structure further includes a mask insulating layer, which is used to pattern a poly silicon layer into the dummy gate electrode layers. The thickness of the mask insulating layer can be within a range from about 10 nm to about 30 nm in some embodiments, and is in a range from about 15 nm to about 20 nm in other embodiments.

Figure 3:
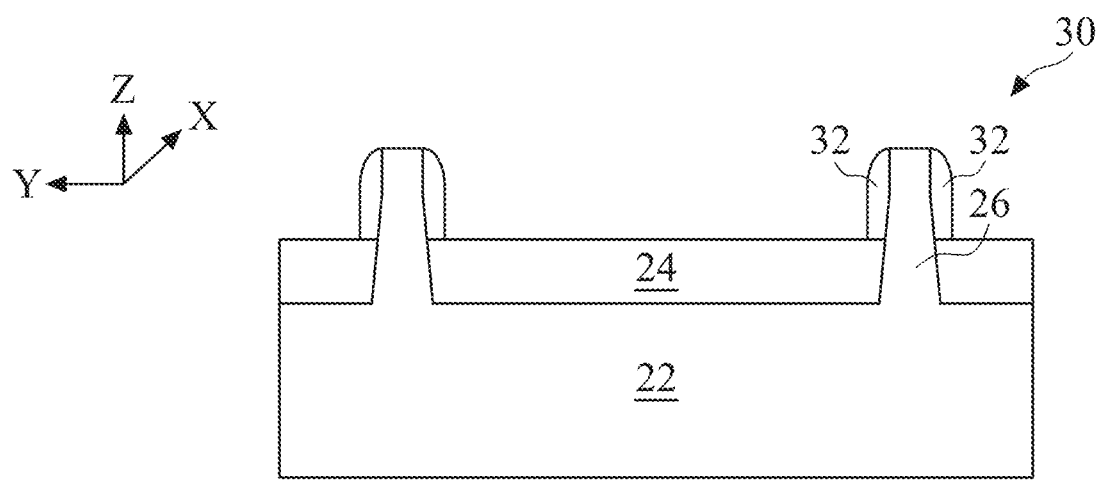
FIG. 3 depicts one stage in a method of manufacturing a semiconductor device according to one or more embodiments of the present disclosure.

In S12 of FIG. 1, a second dielectric layer, as depicted in an X-cut view 30, along CC' of FIG. 2A, shown in FIG. 3, is formed. The second dielectric layer 32 is formed over sidewalls of the first portion 28 (shown in FIG. 2B) of the fin structure 26. In some embodiments, the second dielectric layer 32 can be silicon nitride (Si$_3$N$_4$), silicon oxide (SiO$_2$), or silicon oxynitride (SiO$_x$N$_y$). The second dielectric layer 32 can be formed using a plasma enhanced chemical vapor deposition (PECVD) or a physical vapor deposition (PVD) process, in some embodiments, or other deposition methods, and can be patterned and etched via known etch processes, such as wet etch, plasma etch, or other etch processes.

Figure 4:
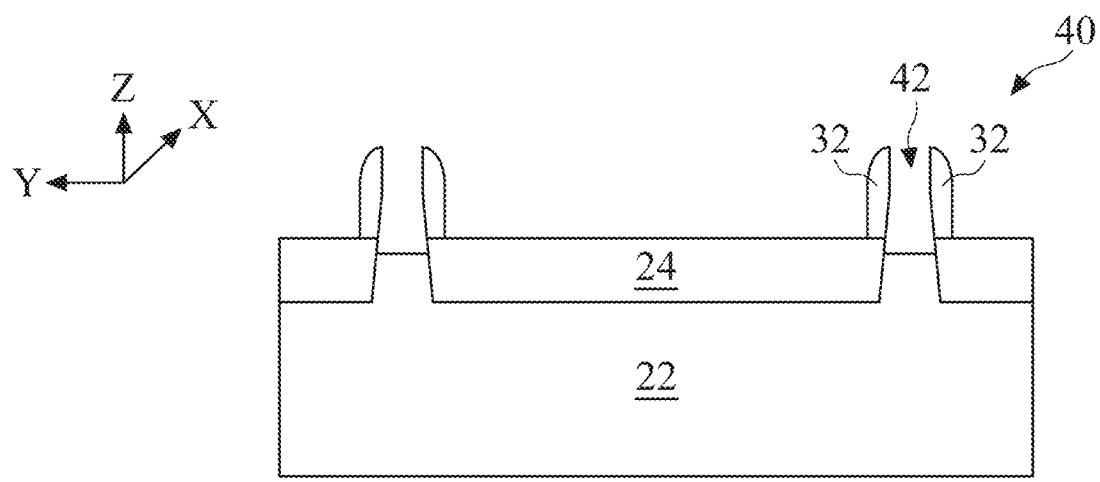
FIG. 4 depicts one stage in a method of manufacturing a semiconductor device according to one or more embodiments of the present disclosure.

In S13 of FIG. 1, a trench 42, as depicted in an X-cut view 40, along line CC' of FIG. 2A, is formed, as shown in FIG. 4. The trench 42 is formed by removing a second portion of the fin structure 26. The second portion of the fin structure 26 includes the first portion 28 and, in some embodiments, trench 42 can further extend into the fin structure 26. In some embodiments, the removal of the second portion of the fin structure 26 can be performed by a suitable etch process, for example, a dry etch process such as a plasma etch. Although other etch processes can be used, in other embodiments. The trench 42 is an opening for formation of the source/drain (SD) epitaxial structures. Therefore, the trench 42 is formed in positions on the fin structure 26 (along the X direction) that correspond to SD epitaxial structures.

Figure 5:
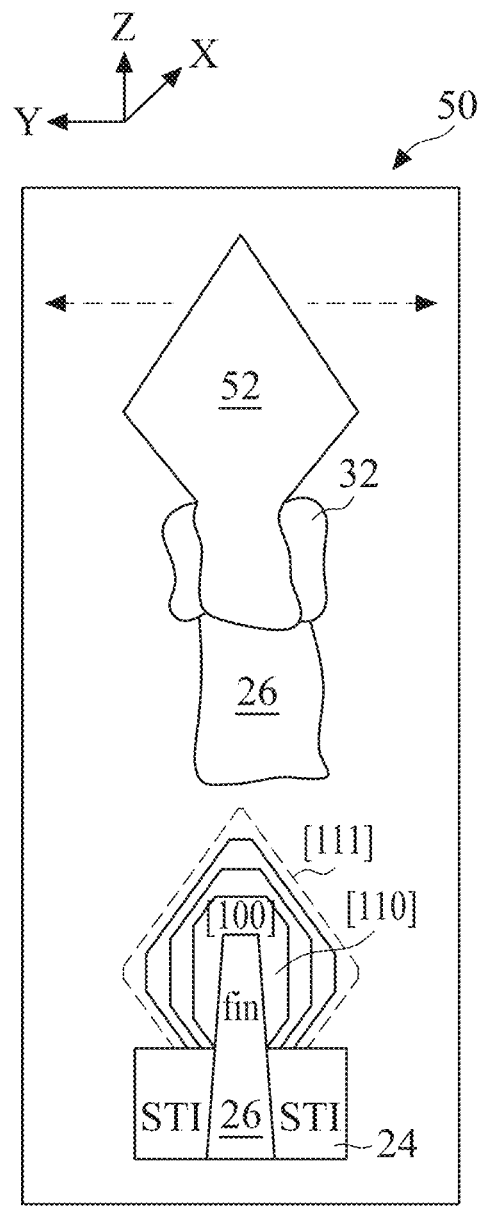
FIG. 5 is a diagram depicting an example of a source/drain (SD) epitaxial layer of a semiconductor device.
Figure 6:
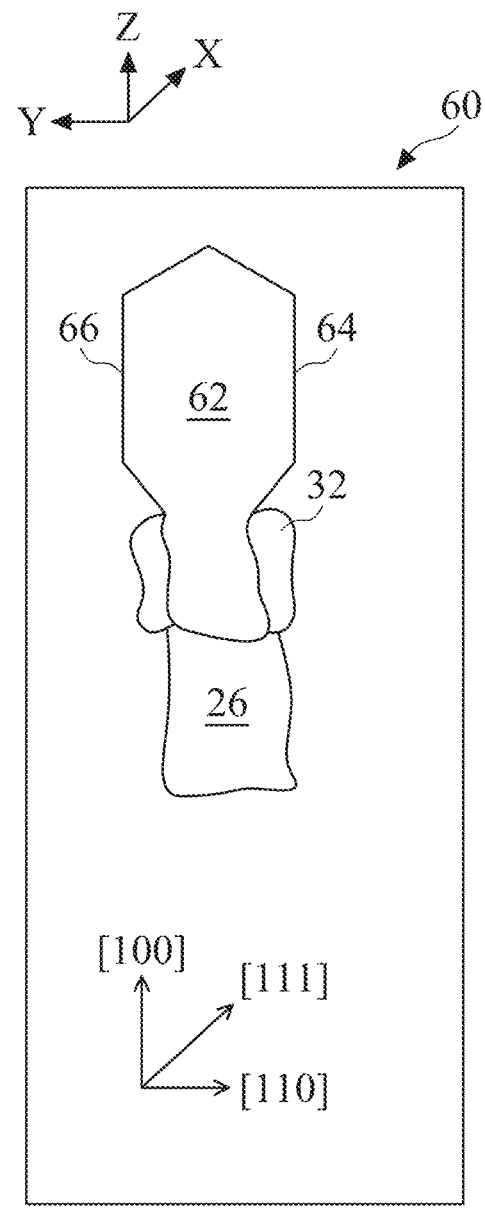
FIG. 6 is a diagram depicting an improved SD epitaxial layer of a semiconductor device using a first process according to one or more embodiments of the present disclosure.

In S14 of FIG. 1, the SD epitaxial structure, as depicted in an X-cut view 60 shown in FIG. 6 is formed. In the X-cut view 60, only part of the fin structure 26, the SD epitaxial structure, including a top portion 62, formed in the trench 42 of FIG. 4, and the second dielectric layer 32 are shown and the substrate 22 is skipped. Further, in order to better understand the improvements achieved by the subject technology, an example of an SD epitaxial structure is depicted in the X-cut view 50 shown in FIG. 5. This SD epitaxial structure has a diamond shape top 52 and is formed using an epitaxial growth process. The large volume of the diamond shape top 52, although is good for providing a low SD epitaxial structure resistance, but can be problematic and cause unacceptable damages, in particular, for the case of high device density integrated circuits such as SRAMs and oscillators. The large lateral growth with a (110) orientation compared to the growth with the (100) and (111) orientations is the source of the problem with the diamond shape top 52 of the epitaxial formation.

In the SD epitaxial structure of the subject technology, as depicted in the X-cut view 60 shown in FIG. 6, the top portion 62 is different from the diamond shape top 52 of the SD epitaxial structure of FIG. 5, in that the lateral growth (e.g., in the (110) orientation) is depressed in favor of growth with the (100) orientation. In other words, the epitaxial deposition for the SD epitaxial structure of the subject technology has a higher growth rate for a preferred crystallographic facet, e.g., (100) orientation. The epitaxial deposition is performed with enhanced (100)/(111) and (100)/(110) growth ratios (e.g., within a range of about 3-5). The (100)/(111) or (100)/(110) growth ratio means a ratio of a growth rate of the epitaxial layer in the <100> direction with respect to that in the <111> or <110> direction.

The subject technology can achieve the higher growth rate for the preferred crystallographic facet (e.g., (100)) by using one of a first or a second process for forming the SD epitaxial structures with the desired shape of the top portion 62. In some embodiments the top portion 62 with desired shape has flat side surfaces 64 and 66. The surface areas of the flat side surfaces 64 and 66 can be equal or different in some embodiments. The first process can be a high temperature epitaxial growth process that warrants the enhanced growth rate for the preferred crystallographic facet (e.g., (100)) as described in more details herein. The second process is a modified etch process that can be performed after the epitaxial growth at nominal conditions (e.g., as shown in FIG. 5) in the trench 42 of FIG. 4, as further described below.

In S15 of FIG. 1, a gate structure can be formed over the fin structure 26 of FIG. 3 as a further stage of realizing a semiconductor device (e.g., a NMOS or PMOS). The gate structure is formed by using a process that utilizes the dummy gate structure discussed above. The process includes a first etching stop layer (ESL) and a first interlayer insulating (ILD) layer that are formed over the dummy gate structure and the SD epitaxial structure. The first ESL includes one or more layers of insulating material such as silicon nitride based material including SiN, SiCN and SiOCN. The thickness of the first ESL is in a range from about 3 nm to about 10 nm in some embodiments. The first ILD layer includes one or more layers of insulating material such as silicon oxide based material such as silicon dioxide ($SiO_2$) and SiON.

After a planarization operation on the first ILD layer and the ESL, portions of the dummy gate structure is removed leaving the gate sidewall spacers in the gate space. Next, a gate dielectric layer is formed. The gate dielectric layer includes one or more layers of dielectric material, such as a high-k dielectric material. The high-k dielectric material can comprise metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, an interfacial layer made of, for example, silicon oxide is formed over the fin structure (channel region) before forming the gate dielectric layer. Further, a work function adjustment (WFA) layer is formed in the gate space and a blanket layer of a suitable conductive material is formed over the gate spaces and the first ILD layer. Finally, the gate electrode layer is formed over the blanket layer. In some embodiments, the gate electrode layer is a poly-silicon. The patterning of the poly-silicon layer is performed by using a hard mask including a silicon nitride layer and an oxide layer in some embodiments. In other embodiments, the gate electrode layer includes a single layer or a multilayer structure. Further, the gate electrode layer may be doped poly-silicon with uniform or non-uniform doping. In some alternative embodiments, the gate electrode layer includes a metal such as Al, Cu, W, Ti, Ta, TiN, TiAl, TiAlN, TaN, NiSi, CoSi, and other conductive materials with a work function compatible with the substrate material, or combinations thereof. The electrode layer for the gate electrode layer may be formed using a suitable process such as atomic layer deposition (ALD), CVD, PVD, plating, or combinations thereof. The width of the gate electrode layer (in the X direction) is in the range of about 30 nm to about 60 nm in some embodiments.

Now returning to FIG. 6, as explained above, the formation of the SD epitaxial structure with a reduced lateral dimension can be pursued using a high-temperature deposition technique or a modified etch method. One of the objectives of the high temperature deposition process is to promote the growth of the crystallographic facet (100) and possibly impede the growth of the crystallographic facets (110) and (111). The high temperature deposition process can be different for NMOS and PMOS devices.

In some embodiments, for NMOS devices, the SD epitaxial structure (e.g., as in 60 of FIG. 6) is an epitaxial formation of a semiconductor material that is formed using a high temperature and pressure deposition process such as a chemical vapor deposition (CVD) process, although other deposition methods can be used in other embodiments. The CVD process can be performed at a high temperature that is within a range of about 650-700° C. and a high pressure that is within a range of about 200-350 Torr.

In other embodiments, when PMOS devices are to be formed, the SD epitaxial structure (e.g., as in 60 of FIG. 6) is an epitaxial formation of a semiconductor material that is formed using a high temperature deposition process such as a CVD process, or other deposition methods in other embodiments. The CVD process can be performed at a high temperature that is within a range of about 600-650° C. and a pressure within a range of about 5-50 Torr.

In one or more implementations, example semiconductor materials that can be used for the SD epitaxial structures include Si, SiP, SiC, SiCP, SiGe, Ge, or Group III-V materials, or any other suitable semiconductor material. In some implementations, the SD epitaxial layers can be deposited using, for example, ALD, PVD, molecular beam epitaxy (MBE) or other suitable epitaxial deposition techniques. In some embodiments, an optional annealing process, for example, at a temperature within the range of about 250-350 degrees C. can be performed to improve the metal-to-source/drain contact resistance.

The modified etch process can be performed after the epitaxial deposition at nominal conditions (e.g., to form SD epitaxial structure as shown in FIG. 5) in the trench 42 of FIG. 4. For example, for PMOS device formation, the nominal conditions can be using a mixture of dichlorosilane ($SiH_2Cl_2$) plus germane ($GeH_4$) as a process gas and at a process temperature within a range of about 600-620° C. and a pressure within a range of about 5-10 Torr. In some embodiments, for NMOS device formation, the nominal conditions can be using a mixture of dichlorosilane ($SiH_2Cl_2$) with phosphine ($PH_3$) as a dopant and at a process temperature within a range of about 650-670° C. and a pressure within a range of about 200-250 Torr.

Figure 7:
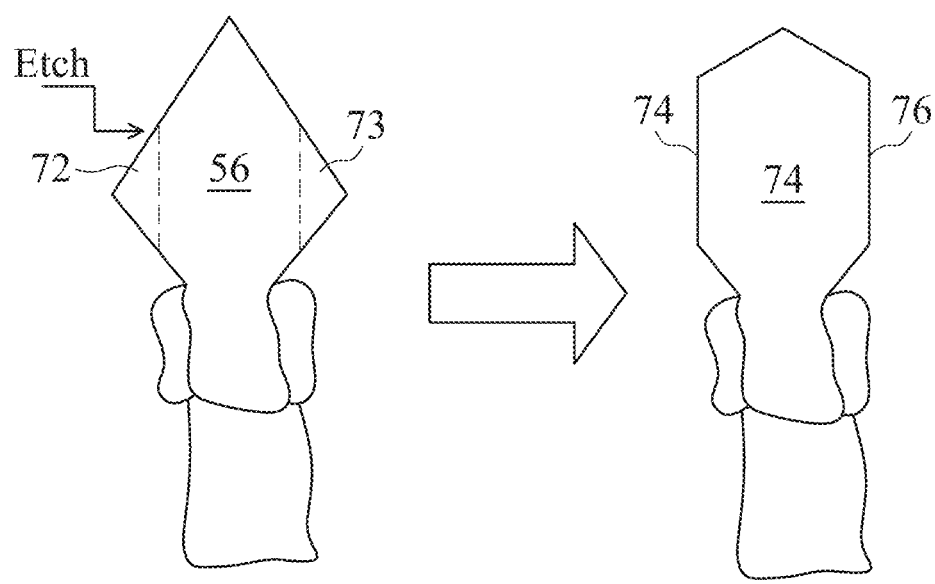
FIG. 7 is a diagram depicting an improved SD epitaxial layer of a semiconductor device using a second process according to one or more embodiments of the present disclosure.

In the modified etch process, as shown in FIG. 7, lateral portions 72 and 73 of the diamond shape top 56 are removed to form the top portion 76 with flat side surfaces 74 and 76. This can improve device performance as making the diamond shape top 56 laterally narrower significantly reduces the chance of unwanted contacts and thereby suppressing leakage between two neighboring SD epitaxial structures. In some embodiments, the modified etch process can be a CVD etch process, although other etch processes may be applied in other embodiments.

In some embodiments, for NMOS device formation, the modified etch process can be an anisotropic etch operation performed using a mixture of germanium tetrahydride ($GeH_4$) and hydrochloric acid (HCl) with a $GeH_4$ to HCl mixture ratio within a range of about 0.5-1.2. The CVD etch operation can be performed at a high temperature within a range of about 650-750° C. and a pressure within a range of about 5-100 Torr. In other embodiments, other etch processes using different process conditions can be used. In the CVD etch process, a film deposition process and an etching process are simultaneously occur, and by adjusting process conditions, it is possible to control configurations (dimensions, shape and etc.) of an formed structure.

In other embodiments, for NMOS device formation, the modified etch process can be an etch operation performed using a mixture of silicon tetrahydride (silane, $SiH_4$) and HCl with a $SiH_4$ to HCl mixture ratio within a range of about 0.2-0.25. This CVD etch operation can be performed operation can be performed at a high temperature within a range of about 650-750° C. and a pressure within a range of about 5-100 Torr. Other etch processes using different process conditions may be used, in other embodiments.

In some embodiments, when a PMOS device is to be formed, the modified etch process can be a CVD etch operation using HCl at a flow rate within a range of about 50-120 sccm. The CVD etch process can be performed at a temperature within a range of about 600-650° C. and a pressure within a range of about 5-50 Torr. In other embodiments, other etch processes using different process conditions can be used.

Figure 8:
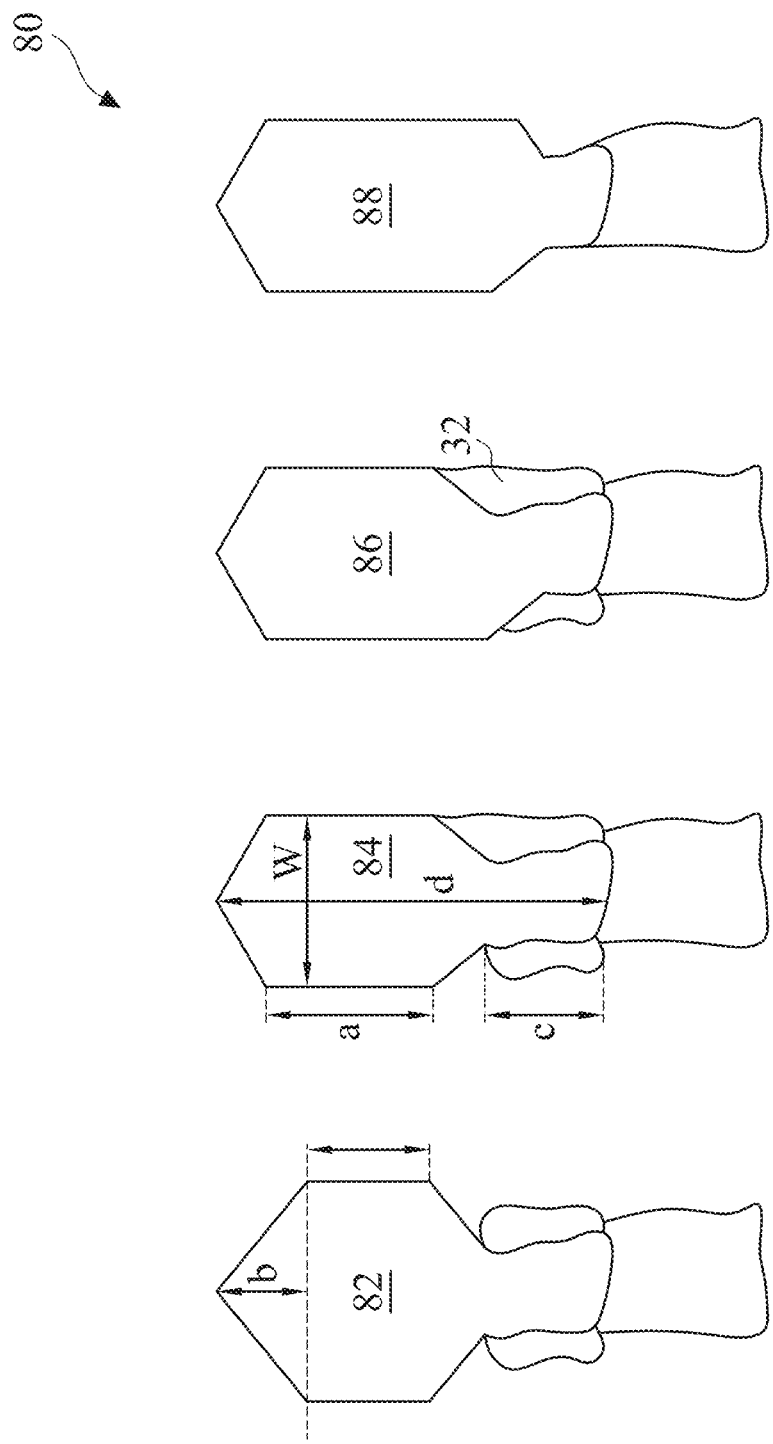
FIG. 8 is a diagram depicting various improved SD epitaxial structures of a semiconductor device according to one or more embodiments of the present disclosure.

FIG. 8 is a diagram depicting various improved SD epitaxial structures 80 (82, 84, 86, and 88) of a semiconductor device according to one or more embodiments of the present disclosure. The improved SD epitaxial structures 82, 84, 86, and 88 can be realized by using one of the high temperature deposition processes or the modified etch processes described above with respect to FIGS. 6 and 7. As described above, one of the objectives of the high temperature deposition process is to promote the growth of the crystallographic (100) and possibly impede the growth of the crystallographic (110) and (111). The modified etch process of the subject disclosure produces the SD epitaxial structures with laterally smaller top portion using, for example, a CVD etch process after the formation in nominal condition of the SD epitaxial structure. The resultant SD epitaxial structures of both processes (e.g., high-temperature deposition and modified etch) are similar to the SD epitaxial structures 82, 84, 86, and 88, which have flat side surfaces with different dimensions such as "a" and "b" shown in FIG. 8. The dimension "a" depicts a height of a flat side of the SD epitaxial structures and the dimension "b" is a measure of a height of a top triangle shape of the SD epitaxial structures. In some embodiments, the SD epitaxial structures (e.g., 82, 84, 86, and 88) can have different "a", "b", and "w" dimensions, where "w" is the width of the SD epitaxial structure along a direction in which the gate extends. For example, the values of "a" can be within a range of about 5 to 60 nm, the values of "b" can be within a range of about 5 to 10 nm, and the values of "w" can be within a range of about 5 to 30 nm in some embodiments. A ratio of the height "d" of the SD epitaxial structure to the height "c" of the second dialectic 32, also known as fin-side-wall (FSW), can be within a range of about 5.6 to 6.2, in some embodiments. The FSW 32 can have different heights for different sides of each SD epitaxial structure (e.g., 86), in some embodiments. In other embodiments, the FSW does not exist (e.g., is removed, as in 88). In some embodiments, a value of the ratio d/w can be within a range of about 6 to 10, and a value of the ratio a/w can be within a range of about 4 to 7.

Figure 9:
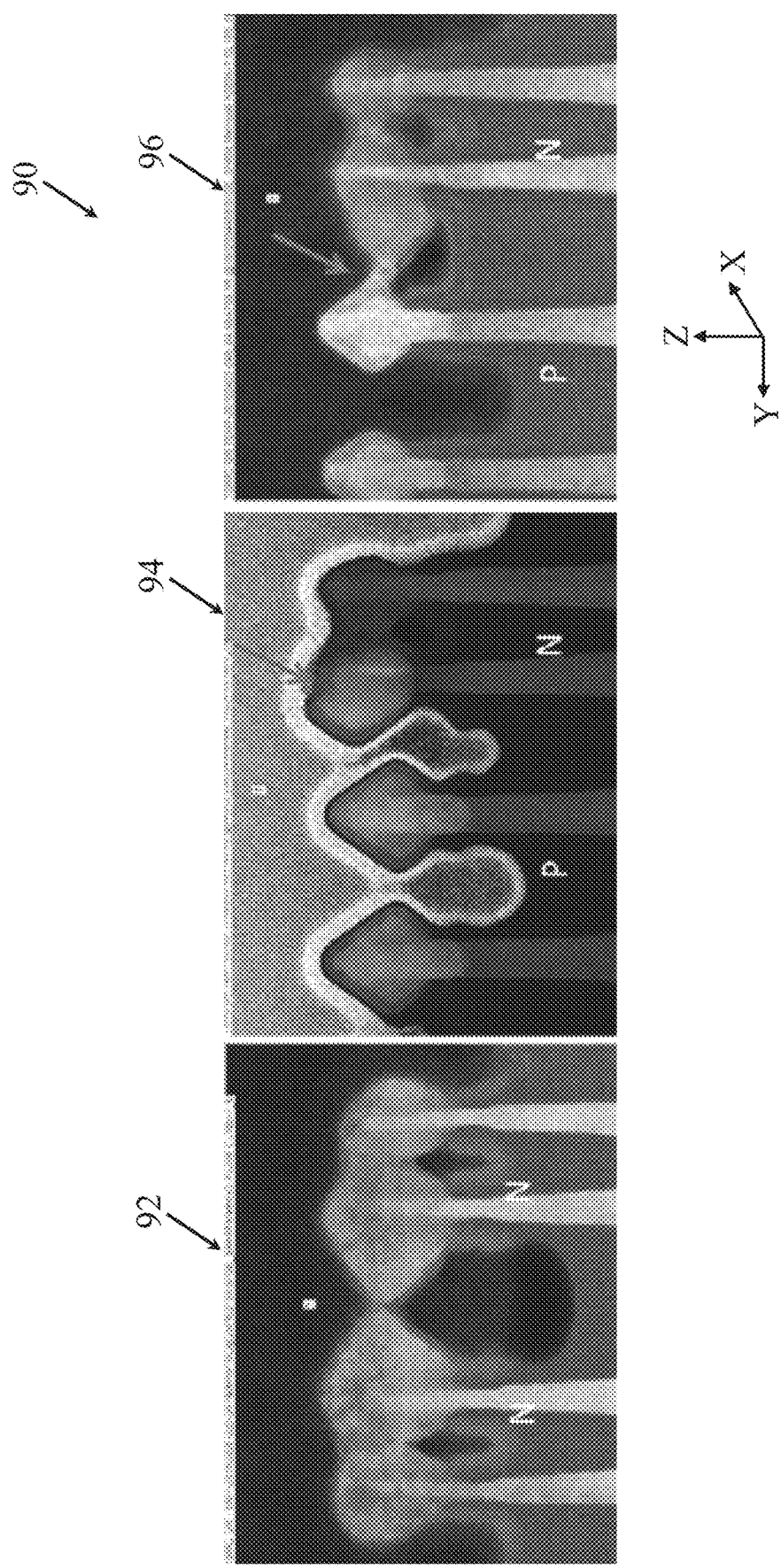
FIG. 9 is a diagram depicting shapes of SD epitaxial structures of a semiconductor device that are preventable if the manufacturing techniques of the present disclosure are used.

FIG. 9 is a diagram depicting various shapes 90 of SD epitaxial structures of a semiconductor device formed using the manufacturing techniques of the present disclosure. The shapes 92, 94, and 96 show irregularities in the device structures due to large lateral extension of the top portions of the SD epitaxial structures 91, 93, 95, 97 and/or 99. As seen from the figure, the shape 92 shows a short circuit between two neighboring N-type structures. In the shape 94, there is an irregular N-type structure, and the shape 96 shows a short circuit between two neighboring N and P-type structures. These and similar irregularities, which result in leakage and possibly dysfunctional respective devices, can be prevented by forming the SD epitaxial structures using one of the high temperature processes or the modified etch processes of the subject technology, as described above.

In some embodiment of the present disclosure, the aforementioned etch process is performed after the enhanced epitaxial growth process to obtain more preferable shape of the SD epitaxial layer.

Figure 10:
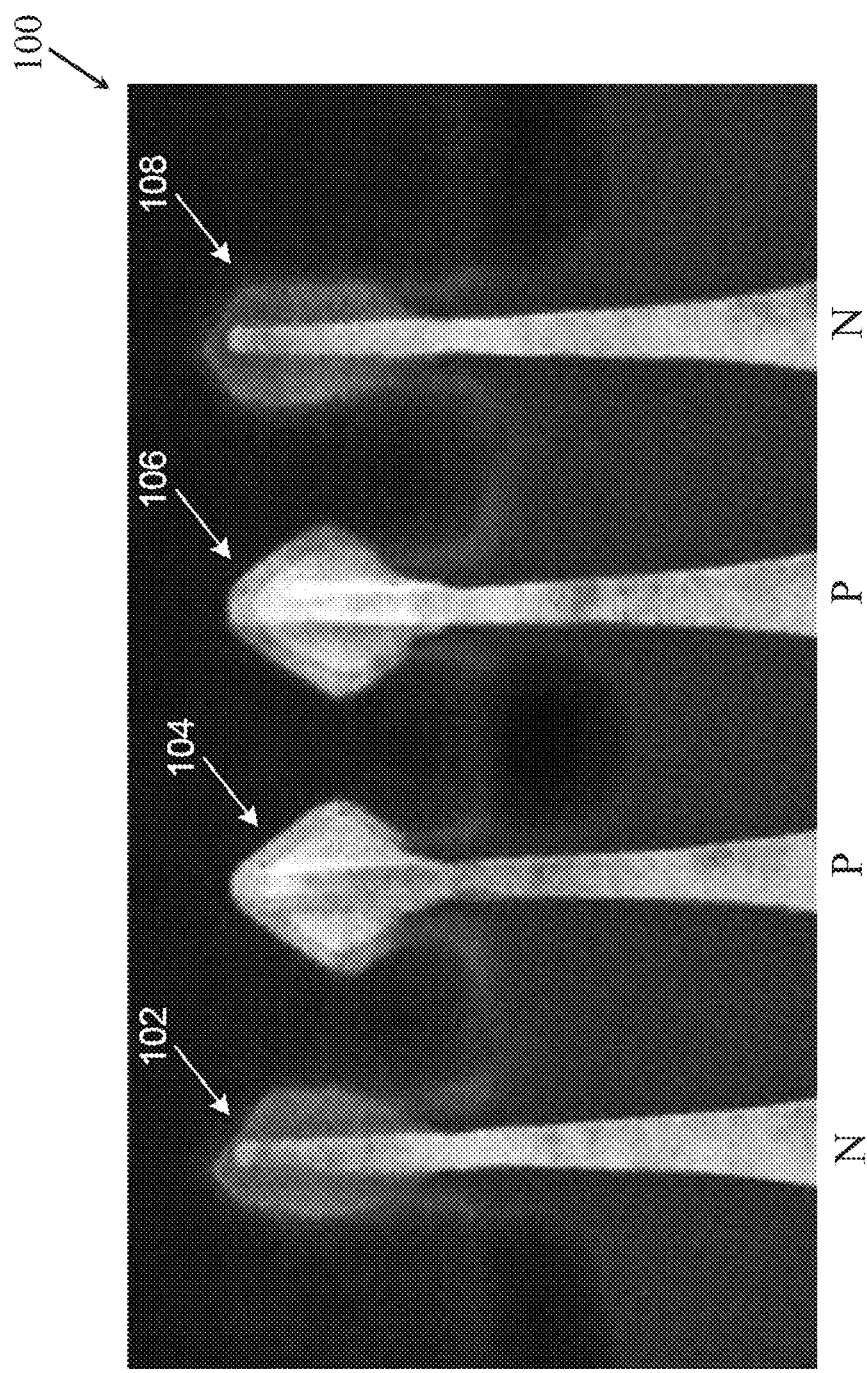
FIG. 10 is a diagram depicting shapes of SD epitaxial structures of a semiconductor device manufactured using manufacturing techniques of the present disclosure.

FIG. 10 is a diagram depicting shapes 100 of un-damaged SD epitaxial structures of a semiconductor device manufactured using manufacturing techniques of the present disclosure. The shapes 102, 104, 106, and 108 depict N and P-type device structures which show no signs of damage due to large lateral extension of the top portions of the SD epitaxial structures 101, 103, 105 and 107. As seen from the figure, the shapes 102 and 108 show N-type structures with limited lateral growth as a result of using one of the high temperature processes or the modified etch processes of the subject disclosure. The two neighboring P-type structures are formed with normal lateral growth. The limited lateral growth of the N-type structure seems to be slightly different for the two N-type device structures. Some difference in lateral growth can be expected if the sidewall spacers (e.g., 32 of FIG. 3) are quite the same for the two structures. It is understood that an asymmetry in the sidewall spacers may result in preventing one side epitaxial growth. It will be understood that not all advantages have been necessarily discussed herein, no particular advantage is required for all embodiments or examples, and other embodiments or examples may offer different advantages.

The process concepts described above can be integrated into the present MOSFET fabrication process, and can be implemented in a number of different technology nodes.

In accordance with one aspect of the present disclosure, in a method for manufacturing a semiconductor device, an isolation insulating layer is formed over a fin structure. A first portion of the fin structure is exposed from and a second portion of the fin structure is embedded in the isolation insulating layer. A dielectric layer is formed over sidewalls of the first portion of the fin structure. The first portion of the fin structure and a part of the second portion of the fin structure in a source/drain region are removed, thereby forming a trench. A source/drain epitaxial structure is formed in the trench using one of a first process or a second process. The first process comprises an enhanced epitaxial growth process having an enhanced growth rate for a preferred crystallographic facet, and the second process comprises using a modified etch process to reduce a width of the source/drain epitaxial structure. In some embodiments, using asymmetric sidewall spacers may result in preventing one side epitaxial growth and can be used as a technique to affect the epitaxial growth symmetry. In some embodiments, the epitaxial deposition is performed with enhanced (100)/(111) and (100)/(110) growth ratios (e.g., within a range of about 3-5). The semiconductor device can be an NMOS device, for which the first process is performed using a first temperature and pressure deposition process. In some embodiments, the first temperature and pressure deposition process includes a chemical vapor deposition (CVD) process, and the high temperature is within a range of about 650-700° C. and the high pressure is within a range of about 200-350 Torr. In some embodiments, the semiconductor device is a PMOS device, for which the first process is performed using a CVD process at a high temperature within a range of about 600-650° C. and a pressure within a range of about 5-50 Torr. When the semiconductor device is an NMOS device, the second process can be a CVD etch operation that can be performed using a mixture of germanium tetrahydride (germane, $GeH_4$) and hydrochloric acid (HCl) with a $GeH_4$ to HCl mixture ratio within a range of about 0.5-1.2 and at a high temperature within a range of about 650-750° C. and a pressure within a range of about 5-100 Torr, in some embodiments. In other embodiments, the CVD etch operation is performed using a mixture of silicon tetrahydride ($SiH_4$) and HCl with a $SiH_4$ to HCl mixture ratio within a range of about 0.2-0.25 and at a high temperature within a range of about 650-750° C. and a pressure within a range of about 5-100 Torr. When the semiconductor device is a PMOS device, the second process is a CVD etch operation using HCl at a flow rate within a range of about 50-120 sccm, a temperature within a range of about 600-650° C., and a pressure within a range of about 5-50 Torr. In some embodiments, the first dielectric layer is a shallow trench isolation (STI) material, and the dielectric layer is silicon nitride ($Si_3N_4$), silicon oxide ($SiO_2$), or silicon oxynitride ($SiO_xN_y$). The dielectric layer over two sidewalls of the first portion of the fin structure can be asymmetric. This results in an asymmetry of the S/D epitaxial structure formed by the enhanced epitaxial growth process.

In accordance with another aspect of the present disclosure, a method for manufacturing a semiconductor device includes forming a first structure extending in a first direction, the first structure and including a fin made of a first material and having a first portion exposed and a second portion embedded. A dielectric layer is formed over sidewalls of the first portion of the fin. The first material is removed from the first portion and a part of the second portion of the fin in a source/drain region, thereby forming a trench. A source/drain (SD) epitaxial structure is formed in and above the trench. A modified etch process is performed to partially remove portions of a top part of the epitaxial structure grown in a second direction perpendicular to the first direction, thereby producing flat sides on the top part of the epitaxial structure. The first structure includes an isolation insulating layer deposited on the second portion of the fin, and the first material is a substrate material. In some embodiments, the semiconductor device is an NMOS device, and the modified etch process is a CVD etch operation. In some embodiments, the CVD etch operation is performed using a mixture of $GeH_4$ and HCl with a $GeH_4$ to HCl mixture ratio within a range of about 0.5-1.2. In some embodiments, the CVD etch operation is performed at a temperature within a range of about 650-750° C. and a pressure within a range of about 5-100 Torr. In some embodiments, the CVD etch operation is performed using a mixture of silicon tetrahydride ($SiH_4$) and HCl with a $SiH_4$ to HCl mixture ratio within a range of about 0.2-0.25. The CVD etch operation is performed at a temperature within a range of about 650-750° C. and a pressure within a range of about 5-100 Torr, in some embodiments. In some embodiments, the semiconductor device is a PMOS device, and the modified etch process is a CVD etch operation using HCl at a flow rate within a range of about 50-120 sccm. The CVD etch operation is performed at a temperature within a range of about 600-650° C. and a pressure within a range of about 5-50 Torr, in some embodiments.

In accordance with yet another aspect of the present disclosure, a semiconductor device includes a Fin FET device. The Fin FET device includes a fin structure protruding from a substrate layer in a first direction and extending in a second direction perpendicular to the first direction. A source/drain (SD) epitaxial structure is disposed on the fin structure. A gate stack, including a gate electrode layer and a gate dielectric layer, covers a portion of the fin structure and extends in the first direction. The SD epitaxial structure has a triangle-shape top with limited lateral growth in the second direction and including flat side surfaces parallel to the first direction.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field-effect-transistor (FinFET) device, comprising:
a fin structure protruding from a substrate layer in a first direction and extending in a second direction perpendicular to the first direction;
a source/drain epitaxial layer disposed over the fin structure; and
a dielectric layer disposed over sidewalls of a bottom part of the source/drain epitaxial layer, wherein:
the dielectric layer that covers the sidewalls of the bottom part of the source/drain epitaxial layer is asymmetric with respect to a central axis of the source/drain epitaxial layer,
an upper part of the source/drain epitaxial layer above the dielectric layer is asymmetric with respect to the central axis,
a first portion of the source/drain epitaxial layer has a preferred (100) crystallographic orientation, and
a second portion of the source/drain epitaxial layer has a depressed (110) crystallographic orientation.

2. The FinFET device of claim 1, further comprising:
an isolation insulating layer disposed over the substrate layer, wherein:
an upper part of the fin structure protrudes outward from the isolation insulating layer and is exposed from the isolation insulating layer and a lower part of the fin structure is embedded in the isolation insulating layer.

3. The FinFET device of claim 2, wherein the isolation insulating layer comprises a shallow trench isolation (STI) material.

4. The FinFET device of claim 1, wherein the FinFET device comprises a PMOS device.

5. The FinFET device of claim 1, wherein:
an extent of the source/drain epitaxial layer in the second direction is limited to outer sidewalls of the dielectric layer.

6. The FinFET device of claim 1, wherein the dielectric layer comprises silicon nitride, silicon oxide, or silicon oxynitride.

7. The FinFET device of claim 1, wherein the source/drain epitaxial layer further comprises a third portion having a depressed crystallographic (111) orientation.

8. A semiconductor device, comprising:
a fin structure disposed on a substrate, the fin structure protruding from the substrate in a first direction and extending in a second direction perpendicular to the first direction;
an isolation insulating layer disposed over the fin structure, wherein an upper portion of the fin structure is exposed from the isolation insulating layer and a lower portion of the fin structure is embedded in the isolation insulating layer;
a source/drain epitaxial layer disposed over the fin structure; and
a dielectric layer disposed over sidewalls of a lower part of the source/drain epitaxial layer, wherein:
the dielectric layer is in contact with the upper portion of the fin structure and the source/drain epitaxial layer, the dielectric layer that covers the sidewalls of the source/drain epitaxial layer is asymmetric with respect to a central axis of the source/drain epitaxial layer,
a first portion of the source/drain epitaxial layer has a preferred (100) crystallographic orientation, and
a second portion of the source/drain epitaxial layer has a depressed (110) crystallographic orientation.

9. The semiconductor device of claim 8, wherein the semiconductor device comprises an NMOS device.

10. The semiconductor device of claim 8, wherein the dielectric layer comprises silicon nitride, silicon oxide, or silicon oxynitride.

11. The semiconductor device of claim 8, wherein side surfaces of the source/drain epitaxial layer in the second direction are flat.

12. The semiconductor device of claim 11, wherein:
the side surfaces of the source/drain epitaxial layer in the second direction are above outer sidewalls of the dielectric layer.

13. The semiconductor device of claim 8, wherein an upper part of the source/drain epitaxial layer has a diamond shape.

14. The semiconductor device of claim 8, wherein a ratio of a height of the source/drain epitaxial layer over a height of the dielectric layer on opposite ends of the fin structure is between 5.6 to 6.2.

15. The semiconductor device of claim 8, wherein an upper part of the source/drain epitaxial layer above the dielectric layer is asymmetric with respect to the central axis.

16. The semiconductor device of claim 8, wherein the source/drain epitaxial layer further comprises a third portion having a depressed crystallographic (111) orientation.

17. A semiconductor device, comprising:
a fin structure protruding from a substrate layer in a first direction and extending in a second direction perpendicular to the first direction;
a source/drain epitaxial layer disposed over the fin structure;
a first dielectric layer disposed over a first sidewall of a bottom part of the source/drain epitaxial layer; and
a second dielectric layer disposed over a second sidewall of the bottom part of the source/drain epitaxial layer opposite to the first sidewall,
wherein a height to the first dielectric layer is different from a height of the second dielectric layer,
wherein a first portion of the source/drain epitaxial layer has a preferred (100) crystallographic orientation, and
wherein a second portion of the source/drain epitaxial layer has a depressed (110) crystallographic orientation.

18. The semiconductor device of claim 17, wherein a largest thickness of the first dielectric layer is different from a largest thickness of the second dielectric layer.

19. The semiconductor device of claim 17, wherein:
one of side surfaces of the source/drain epitaxial layer is a flat surface, and
a vertical length of the flat surface is greater than a vertical length of the first dielectric layer.

20. The semiconductor device of claim 17, wherein the first and second dielectric layers comprise silicon nitride, silicon oxide, or silicon oxynitride.

* * * * *